(12) United States Patent
D'Abreu

(10) Patent No.: US 9,760,481 B2
(45) Date of Patent: Sep. 12, 2017

(54) MULTIPORT MEMORY

(71) Applicant: SANDISK TECHNOLOGIES INC., Plano, TX (US)

(72) Inventor: Manuel Antonio D'Abreu, El Dorado Hills, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 11 days.

(21) Appl. No.: 14/304,323

(22) Filed: Jun. 13, 2014

(65) Prior Publication Data

US 2015/0364162 A1    Dec. 17, 2015

(51) Int. Cl.
  *G06F 12/02* (2006.01)
  *G11C 7/10* (2006.01)
  *G11C 8/06* (2006.01)

(52) U.S. Cl.
  CPC ........ *G06F 12/0246* (2013.01); *G11C 7/1075* (2013.01); *G06F 2212/7201* (2013.01); *G06F 2212/7208* (2013.01); *G06F 2212/7211* (2013.01); *G11C 8/06* (2013.01)

(58) Field of Classification Search
  CPC .. G06F 3/0689; G06F 11/2089; G06F 11/201; G06F 3/00; G06F 11/1076; G06F 3/0635; G06F 11/2005; G06F 11/2007; G06F 2213/0028; G06F 11/1435; G06F 13/00; G06F 9/5061; G06F 13/1663; G06F 15/7867; G06F 3/0613; G06F 3/0658; G06F 9/38; G06F 9/3842; G06F 9/3885; G06F 13/16; G06F 12/0246; G06F 11/1068; G06F 11/2094; G06F 12/0607; G06F 13/4063

See application file for complete search history.

(56) References Cited

U.S. PATENT DOCUMENTS

| 4,930,066 | A | | 5/1990 | Yokota |
| 5,515,523 | A | | 5/1996 | Kalkunte et al. |
| 5,867,180 | A | * | 2/1999 | Katayama et al. ........... 345/542 |

(Continued)

OTHER PUBLICATIONS

Inside Solid State Drives by Micheloni, Marelli, and Eshghi; Springer 2012 (See Library of Congress Control Number); pp. 53 117-119, 127, 133, 180, 217, 249-252, and 366.*

(Continued)

*Primary Examiner* — Reginald Bragdon
*Assistant Examiner* — Paul Knight
(74) *Attorney, Agent, or Firm* — Toler Law Group, PC

(57) ABSTRACT

A data storage device includes a memory that has a three-dimensional (3D) memory configuration, a controller, and a plurality of memory ports. The controller is configured to read mapping data from the memory. The mapping data maps the plurality of memory ports to the plurality of storage elements. The controller is further configured to, in response to receiving a command associated with a logical address, determine a physical address of the memory corresponding to the logical address, the physical address corresponding to a group of storage elements of the plurality of storage elements. The controller is further configured to select a memory port of the plurality of memory ports, where the memory port is mapped to the group of storage elements. The controller is further configured to access the group of storage elements via the memory port to perform first command.

30 Claims, 5 Drawing Sheets

(56) References Cited

U.S. PATENT DOCUMENTS

| | | | | |
|---|---|---|---|---|
| 6,000,006 A | * | 12/1999 | Bruce | G06F 11/1068 711/103 |
| 6,584,034 B1 | * | 6/2003 | Hsu | G11C 7/18 365/189.04 |
| 6,588,662 B1 | * | 7/2003 | Hu | G06F 11/1456 235/451 |
| 6,980,649 B1 | * | 12/2005 | Batcher | 380/42 |
| 7,523,236 B1 | * | 4/2009 | Nemazie et al. | 710/74 |
| 7,805,587 B1 | * | 9/2010 | Van Dyke | G06F 12/0607 711/202 |
| 8,127,059 B1 | * | 2/2012 | Carr | G06F 13/387 710/74 |
| 8,250,312 B2 | | 8/2012 | Walker et al. | |
| 8,966,174 B2 | * | 2/2015 | Motonaga | G06F 3/0613 711/103 |
| 2002/0194424 A1 | | 12/2002 | Hasegawa et al. | |
| 2003/0163631 A1 | * | 8/2003 | Aasheim | G06F 12/0246 711/103 |
| 2004/0193782 A1 | * | 9/2004 | Bordui | G06F 12/0804 711/103 |
| 2005/0060456 A1 | | 3/2005 | Shrader et al. | |
| 2005/0232285 A1 | * | 10/2005 | Terrell et al. | 370/401 |
| 2005/0289293 A1 | * | 12/2005 | Parris | G11C 8/16 711/106 |
| 2006/0004971 A1 | * | 1/2006 | Kim et al. | 711/154 |
| 2006/0161724 A1 | * | 7/2006 | Bennett | G06F 12/0246 711/103 |
| 2008/0140918 A1 | * | 6/2008 | Sutardja | G06F 12/0246 711/103 |
| 2008/0147920 A1 | * | 6/2008 | Mohan et al. | 710/58 |
| 2008/0183974 A1 | * | 7/2008 | Lambert et al. | 711/149 |
| 2009/0138654 A1 | * | 5/2009 | Sutardja | G06F 12/0246 711/103 |
| 2009/0210691 A1 | * | 8/2009 | Im | G06F 9/4405 713/2 |
| 2010/0205336 A1 | * | 8/2010 | Kakish | G06F 3/14 710/73 |
| 2010/0281227 A1 | * | 11/2010 | Walker | G06F 12/0646 711/149 |
| 2011/0113279 A1 | * | 5/2011 | Cagno | G06F 11/2089 714/5.11 |
| 2012/0017066 A1 | * | 1/2012 | Vorbach et al. | 712/11 |
| 2012/0131268 A1 | * | 5/2012 | Anderson | 711/103 |
| 2012/0239854 A1 | * | 9/2012 | Hsueh | G06F 12/0866 711/103 |
| 2013/0185485 A1 | * | 7/2013 | Kim et al. | 711/103 |
| 2013/0219394 A1 | * | 8/2013 | Goldman et al. | 718/100 |
| 2013/0265877 A1 | * | 10/2013 | Baker et al. | 370/235 |
| 2014/0025902 A1 | * | 1/2014 | Dhogale | G11C 8/18 711/149 |
| 2014/0047229 A1 | * | 2/2014 | Wiseman | G06F 13/14 713/2 |
| 2014/0181434 A1 | * | 6/2014 | Chau | G06F 12/16 711/162 |
| 2014/0189197 A1 | * | 7/2014 | Krithivas | G06F 12/0246 711/103 |
| 2015/0143021 A1 | * | 5/2015 | Bruso | G06F 12/0246 711/103 |

OTHER PUBLICATIONS

Architecture Exploration of High-Performance PCs with a Solid-State Disk by Kim, Bang, Ha, Yoon, and Chung IEEE Jul. 2010.*
Qlogic: Best Practices Guide Fibre Channel Host Bus Adapters on Microsoft Windows 2012 and VMware ESXi 5.x; Qlogic; Revised Oct. 2013; http://filedownloads.qlogic.com/Files/TempDownlods/86218/TechnicalGuide_2500-2600_BestPracticesWin2012-ESXi5x_SN0454502-00A.pdf.*
IEEE Dictionary of Standard Terms; Seventh Edition; 2000.*
Inside Solid State Drives by Micheloni; Springer 2012 (See Library of Congress Control Number); p. 22 added for this action.*

* cited by examiner

US 9,760,481 B2

MULTIPORT MEMORY

FIELD OF THE DISCLOSURE

The present disclosure is generally related to multiport memory.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

As the capacity of non-volatile data storage devices increases (e.g., as a number of storage elements of each data storage device of the memory grows) transferring data within the memory device limits performance. For example, the time required to transfer data from a controller of the data storage device to the memory may decrease performance and user satisfaction.

SUMMARY

A data storage device includes multiple ports between a controller and a memory array. The ports may be mapped such that a portion of the memory array is assigned to a first memory port and another portion of a memory array is assigned to another memory port. The mapping of the memory ports to the portions of the memory array may be dynamic such that mapping may be modified during operation. For example, the controller of the data storage device may maintain mapping data that maps particular storage elements of the memory array to a corresponding memory port or memory ports. The multiple ports may be used concurrently to read or write data from the memory array and may therefore increase a data throughput of the data storage device.

The controller may update or modify the mapping of the ports to the memory array based on information such as performance metrics associated with the memory array. For example, if a particular portion of the memory array is associated with decreased performance, the mapping may be modified to re-allocate assignment of the particular portion of the memory array among multiple ports so as not to decrease performance associated with a single port. Updating mapping based on performance metrics enables balance performance and/or traffic among multiple ports to and may reduce a worst-case performance scenario of the data storage device.

DETAILED DESCRIPTION

Particular embodiments of the present disclosure are described with reference to the drawings. In the description, common features are designated by common reference numbers throughout the drawings.

Figure 1:
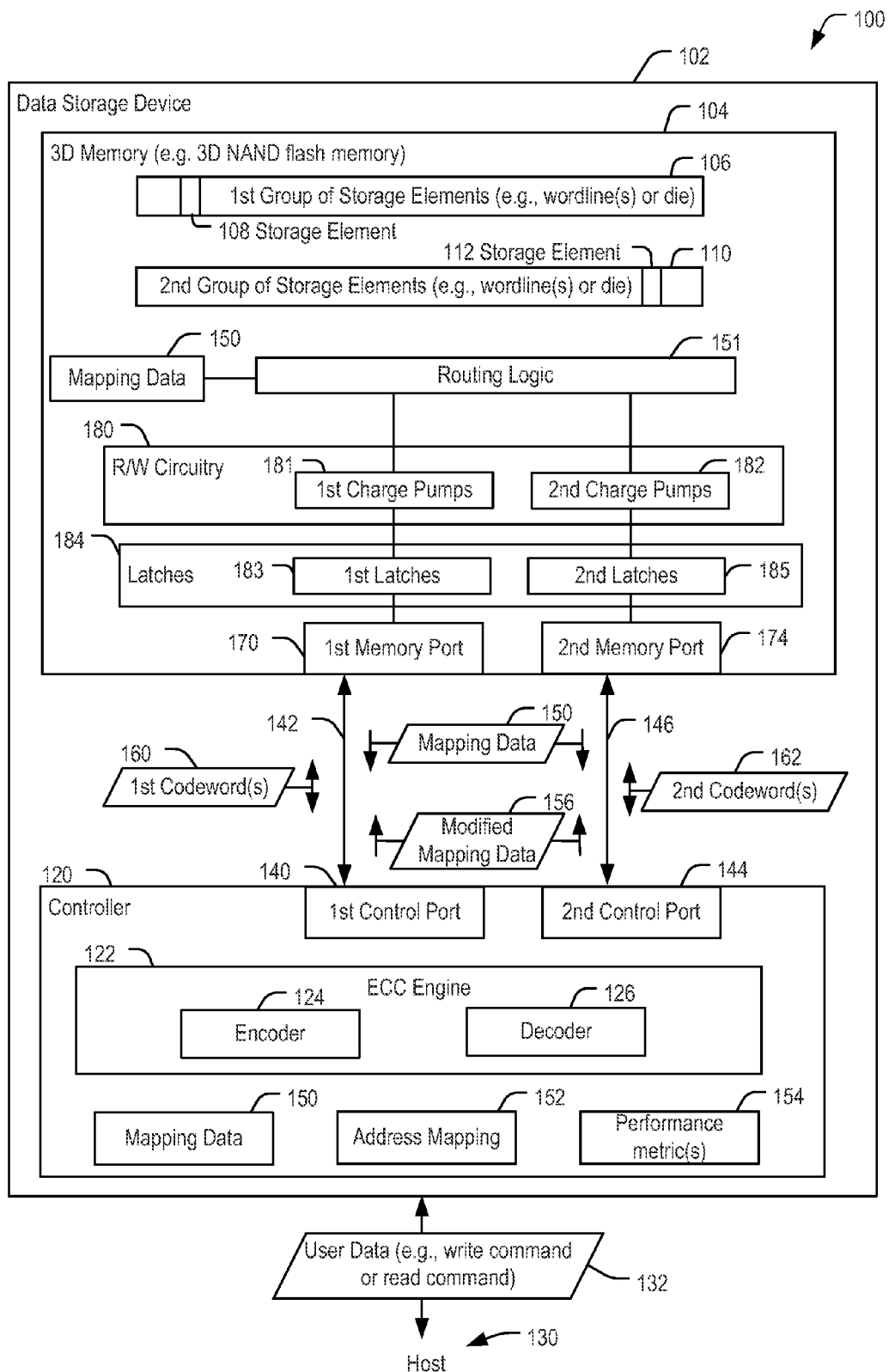
FIG. 1 is a block diagram of a particular illustrative embodiment of a system including a data storage device including multiple ports between a controller and a memory.

FIG. 1 is a block diagram of a particular illustrative embodiment of a system 100 including a data storage device 102. The data storage device 102 includes a controller 120 and three-dimensional (3D) memory 104. The controller 120 and/or the memory 104 may include multiple ports. For example, the memory 104 may include a first memory port 170 and a second memory port 174 that couple the memory 104 to the controller 120. The memory 104 may receive data from the controller 120 and send data to the controller 120 via one or more memory ports, such as the first memory port 170 and the second memory port 174. As another example, the controller 120 may include one or more control ports, such as a first control port 140 and a second control port 144 that couple the controller 120 to the memory 104. The control ports 140, 144 of the controller 120 may be coupled to the ports 170, 174 of the memory 104.

The memory 104 may include multiple groups of storage elements. For example, the memory 104 may include a first group of storage elements 106 including a first representative storage element 108, such as a flash multi-level cell (MLC), and a second group of storage elements 110 including a second representative storage element 112. Each of the groups of storage elements may correspond to one or more wordlines, blocks, planes, memory dies, or another definable group of storage elements.

The controller 120 may include mapping data 150 received from (e.g., stored at) the memory 104. The mapping data 150 may be used to map a particular port (e.g., a particular memory port and/or a particular control port) to a corresponding group of storage elements. For example, the mapping data 150 may map the first memory port 170 to the first group of storage elements 106 and may map the second memory port 174 to the second group of storage elements 110. The controller 120 may also be configured to modify the mapping data 150 to re-allocate particular groups of storage elements between the multiple ports (e.g., the multiple memory ports). For example based on one or more performance metrics 154, the controller 120 may allocate the second group of storage elements 110 to the first memory port 170 and may allocate the first group of storage elements 106 to second memory port 174 by generating modified mapping data 156. The modified mapping data 156 may be provided to the memory 104.

The data storage device 102 may be configured to be coupled to a host device 130 via a communication path, such as a wired communication path and/or a wireless communication path. For example, the data storage device 102 may include an interface (e.g., a host interface) that enables communication (via the communication path) between the data storage device 102 and the host device 130, such as when the interface is coupled to the host device 130.

The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

For example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The host device 130 may be configured to provide data, such as user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The data storage device 102 includes the memory 104 coupled to the controller 120. The memory 104 may be coupled to the controller 120 via a bus, an interface, another structure, or a combination thereof. In a particular embodiment, the first control port 140 is associated with a first bus 142 that couples the first control port 140 and the first memory port 170. Alternatively, or in addition, the second control port 144 is associated with a second bus 146 that couples the second control port 144 to the second memory port 174. Although two dedicated busses are illustrated, each between a pair of ports, in other implementations, the controller 120 may include a single control port that is coupled to both of the memory ports 170, 174 via a single bus. In such an implementation, a protocol and/or a communication scheme may be used to enable the controller 120 to send data and/or commands to each of the memory ports 170, 174. For example, each of the memory ports 170, 174 may be independently addressable by the controller 120. As another example, each of the memory ports 170, 174 may detect a particular command provided by the controller 120 and determine whether to receive the particular command based on the mapping data 150 and an address included in the particular command.

The memory 104 may be a non-volatile memory, such as a NAND flash memory or a resistive random access memory (ReRAM). Examples of 3D NAND and ReRAM architectures are described with reference to FIGS. 5 and 6, respectively.

The memory 104 may include support circuitry associated with each of the groups of storage elements (e.g., groups of data elements). For example, the memory 104 also includes circuitry associated with operation of the storage elements, such as latches 184 (e.g., data latches), read/write circuitry 180, and/or routing logic 151. The latches 184 are configured to store data read from storage elements of the memory 104 or to be written to storage elements. The latches 184 may be associated with various storage elements, such as the first group of storage elements 106 and the second group of storage elements 110. In a particular embodiment, the latches 184 may be associated with ports, such as the first memory port 170 and the second memory port 174. To illustrate, the latches 184 may include a first set of latches 183 associated with the first memory port 170 and a second set of latches 185 associated with the second memory port 174. Data read from storage elements associated with the first memory port 170 may be latched at the first set of latches 183 (e.g., a set of one or more latches). Similarly, data read from storage elements associated with a second port 174 may latched at the second set of latches 185 (e.g., a set of one or more latches).

The read/write circuitry 180 may be configured to control reading of data (e.g., data values) to the data latches 184 or writing of data (e.g., data values) from the data latches 184 to the storage elements of the memory 104. The read/write circuitry 180 may include charge pumps that may be allocated among the memory ports 170, 174. For example, the charge pumps may include a first set of charge pumps 181 associated with the first memory port 170 and a second set of charge pumps 182 associated with the second memory port 174. When a write command associated with the first memory port 170 is performed, the first set of charge pumps 181 associated with the first memory port 170 may be used to perform the write command. Likewise, when a second write command associated with the second memory port 174 is performed, the second set of charge pumps 182 associated with the second memory port 174 may be used to perform the write command. Alternately or in addition, the first set of charge pumps 181 may be associated with the first group of storage elements 106, and the second group of charge pumps 182 may be associated with the second group of storage elements 110.

The routing logic 151 may be coupled to the read/write circuitry 180, to the latches 184, and/or to the memory ports 170, 174. The routing logic 151 may be configured to route data between the memory ports 170-174 and corresponding portions of the memory 104, such as the first group of storage elements 106 and the second group of storage elements 110. For example, the routing logic 151 may be configurable to route data to or from groups of storage elements based on the mapping data 150. Although depicted as separate components, the latches 184, the read/write circuitry 180, the routing logic 151, or a combination thereof, may be combined into a single component (e.g., hardware and/or software) of the memory 104.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104. The controller 120 is configured to access the mapping data 150 to determine a destination memory port 170, 174 based on a target address, as described in more detail below.

The controller 120 includes an ECC engine 122 that is configured to receive data to be stored to the memory 104 and to generate a codeword 160. For example, the ECC engine 122 may include an encoder 124 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder 126 configured to decode data read from the memory 104 to detect and correct, up to an error correction capability of the ECC scheme, any bit errors that may be present in the data.

During startup, in response to power up of the controller 120 (such as at power on or when the data storage device 102 is coupled to the host 130), the controller 120 may read the mapping data 150 from the memory 104 to make the mapping data 150 available to an address mapping module 152. For example, the controller 120 may store the mapping data 150 in a memory (not shown), such as a random access memory (RAM) of the controller 120, that is accessible to the address mapping module 152. The address mapping module 152 may implement mapping of logical addresses to physical addresses, and may also implement mapping of physical addresses to particular ports of the plurality of ports. For example, the physical addresses may be mapped to particular memory ports of the first and second memory ports 170, 172. As another example, the physical addresses may be mapped to particular control ports of the first and second control ports 140, 142. Thus, when the controller 120 generates modified mapping data 156, the modified mapping data 150 may be provided to the memory 104 and stored at the memory 104 for use during a subsequent power up of the controller 120. Accordingly, the particular groups of storage elements may be dynamically mapped to ports by the controller 120.

During operation, the data storage device 102 may be coupled to the host device 130. In response to coupling the data storage device 102 to the host device 130, in response to a command or signal from the host device 130, or in response to power provided by the host device 130, the controller 102 may power up and may read the mapping data 150 from the memory 104. The mapping data 150 maps the plurality of memory ports (such as the control ports 140, 144 and/or the memory ports 170, 174) to the storage elements of the memory 104. For example, the mapping data 150 may map the first control port 140 and/or the first memory port 170 to the first group of storage elements 106 and may map the second port 144 and/or the second memory port 174 to the second group of storage elements 110.

The data storage device 102 may receive user data 132 from the host device 130. The user data 132 may be associated with, for example, a write command or a read command. For example, the data storage device 102 may receive a logical address associated with the user data 132 from the host device 130. The address mapping module 152 may use the mapping data 150 and/or other data to map the logical address of the user data 132 to a physical address corresponding to a set of storage elements of the memory 104. Additionally, the address mapping module 152 may select a particular control port of the controller 120 that corresponds to the physical address. The particular control port of the controller 120 may correspond to (e.g., be coupled to) a particular memory port of the memory 104. To illustrate, when the physical address is an address within the first group of storage elements 106 and the first control port 140 (and/or the first memory port 170) is mapped to the first group of storage elements 106, the address mapping module 152 may select the first control port 140 to receive the command associated with the user data 132.

The controller 120 may access the first set of storage elements 106 via the first control port 140 to perform the command associated with the user data 132. For example, when the command associated with the user data 132 is a write command, the encoder 124 of the ECC engine 122 may generate a codeword 160 based on the user data 132. The controller 120 (e.g., the ECC engine 122) may determine, based on the mapping data 150, which control port (and/or memory port) to use to provide the codeword 160 to the memory 104. For example, based on the mapping data 150, the controller 120 may determine to provide the codeword 160 to the memory 104 via the first control port 140.

The host device 130 may also provide additional user data to the data storage device 102. In response to receiving additional user data associated with a second command, the address mapping module 152 may determine a second physical address associated with the second command For example, the additional user data may be associated with a command and a corresponding logical address. The address mapping module 152 may use the mapping data 150 and/or other data to map the logical address of the additional user data to a physical address corresponding to a set of storage elements of the memory 104. Additionally, the address mapping module 152 may select a particular control port of the controller 120 that corresponds to the physical address. The particular control port of the controller may correspond to (e.g., be coupled to) a particular memory port of the memory 104. To illustrate, when the physical address associated with the second command is within the second group of storage elements 110 and the second group of storage elements is associated with the second control port 144 (and/or the second memory port 174), the address mapping module 152 may map the second command to the second group of storage elements 110 and may select the second control port 144 for accessing the memory 104.

The encoder 124 of the ECC engine 122 may generate a second codeword 162 based on the second command. For example, when the second command associated with the additional user data is a write command, the encoder 124 of the ECC engine 122 may generate a codeword 160 based on the user data 132. The controller 120 (e.g., the ECC engine 122) may determine, based on the mapping data 150, which control port (and/or memory port) to use to provide the second codeword 162 to the memory 104. For example, based on the mapping data 150, the controller 120 may determine to provide the second codeword 162 to the memory 104 via the second control port 144.

When the user data 132 is associated with a read command and a logical address, the address mapping module 152 may map the logical address to a physical address of the memory 104 corresponding to a set of storage elements. Additionally, the address mapping module 152 may select a particular port, such as a particular control port and/or a particular memory port, by mapping the physical address to a port based on the mapping data 150. After selecting the particular port, the controller 120 may send a read request (e.g., a read instruction) to the memory 104 via the selected particular port. The read request may cause the read/write circuitry 180 to read data from the physical address. For example, the data to be read may be latched at the latches 184 corresponding to the group of storage elements 106 and may be provided from the latches 184 to the controller 120 via the selected particular port.

To illustrate, when the read command is associated with a logical address that is mapped, based on the mapping data 150, to the first group of storage elements 106, the controller 120 may determine the first group of storage elements 106 are associated with the first control port 140 and/or the first memory port 170. The controller 120 may send a read request (corresponding to and/or based on the read command) to the memory 104 via the first control port 140 and/or the first memory port 170. The read/write circuitry 180 may receive the read request via the control port 140 and/or the first memory port 170 and may perform a read operation, via the routing logic, on the first group of storage elements 106. The data, such as the first codeword 160, read from the first group of storage elements 106 may be provided to the latches 184 associated with the first group of storage elements 106, such as the first set of latches 183 associated with the first memory port 170. From the latches 184, the data read from the first group of storage elements 106 may be provided to the controller 120 via the first memory port 170, the first bus 142, and/or the first control port 140. The decoder 126 of the ECC engine 122 may decode the data, such as a possibly corrupted version of the first codeword 160, and provide error-corrected user data represented by the data to the host device 130.

In a particular embodiment, the controller 120 may be configured to generate the modified mapping data 156 based on one or more performance metrics 154. The performance metrics 154 may include or correspond to latency associated with each of the groups of storage elements, a reliability of one or more storage elements of the memory 104, wear leveling associated with the memory 104, a number of read operations, write cycles, or other use metric (e.g., erase cycles) associated with each of the storage elements or groups of storage elements, or a combination thereof, as illustrative, non-limiting examples.

For example, the controller 120 may track latency, throughput, bus queue depth, or other performance metrics associated with each of the groups of storage elements, such as the first group of storage elements 106 and/or the second group of storage elements 110. The controller 120 may generate the modified mapping data 156 to change allocation of storage elements to particular ports of the multiple ports (e.g., the control ports 140, 144 and/or the memory ports 170, 172). To illustrate, before generating the modified mapping data 156, the first group of storage elements 106 may be associated with the first control port 140 and/or the first memory port 170 via the mapping data 150, and the second group of storage elements 110 may be associated with the second control port 144 and/or the second memory port 174 via the mapping data 150. Based on the performance metrics 154, the controller 120 may generate the modified mapping data 156. The modified mapping data 156 may associate the first group of storage elements 106 with the second control port 144 and/or the second memory port 174, may associate the second group of storage elements 110 with the first control port 140 and/or the first memory port 170, or both. Additionally, although the groups of storage elements 106 and 110 are described as being re-allocated as a set, the modified mapping data 156 may subdivide the first group of storage elements 106, the second group of storage elements 110, or both. Thus, the modified mapping data 156 may re-allocate any one or more of the storage elements of the memory 104 between the multiple ports (e.g., the control ports 140, 144, the memory ports 170, 174, and/or one or more additional ports (not shown)). In other embodiments, the controller 120 may modify the mapping data 150 to re-allocate one or more memory areas associated with decreased performance to a single memory port which may be dedicated for use with increased latency operations, such as background operations or storing of data that does not require high performance throughput.

As another example, one or more of the performance metrics 154 may be associated with reliability, such as a bit error rate, of particular storage elements of the memory 104. In this example, the controller 120 may allocate groups of storage elements among the multiple ports (e.g., the control ports 140, 144 and/or the memory ports 170, 172) based on the reliability metrics. To illustrate, if a particular portion of the memory 104 is associated with decreased reliability, the mapping data 150 may be modified to re-allocate assignment of the particular portion of the memory 104 among multiple ports so as not to decrease performance associated with a single port. For example, the controller may identify one or more sets of data storage elements with decreased reliability based on the reliability metrics 154. Each set of the one or more sets of data storage elements with decreased reliability may include a single storage element or multiple storage elements. The controller 120 may identify a first distribution (e.g., allocation) among the multiple ports of the one or more sets of data storage elements with decreased reliability based on first mapping data, such as the mapping data 150. If one of the multiple ports is allocated (based on the first distribution) to more storage elements having decreased reliability than another port, such as by an amount that is greater than or equal to a threshold amount, the controller 120 may redistribute (e.g., reallocate) the one or more sets of storage elements having decreased reliability among the multiple ports. For example, the controller 120 may determine a second distribution (e.g., allocation) of the unreliable data storage elements among the multiple ports to establish second mapping data, such as the modified mapping data 156. By redistributing the one or more sets of storage elements with decreased reliability among the multiple ports, the controller 120 may prevent any one port from being associated with too many unreliable storage elements and associated performance degradation.

In another example, one or more of the performance metrics 154 may be associated with read cycles and/or write cycles. In this example, the controller 120 may allocate data storage elements of the memory 104 among the multiple ports (e.g., the control ports 140, 144 and/or the memory ports 170, 172) for wear-leveling associated with the memory 104. To illustrate, the controller 120 may include a free block(s) queue that indicates an order of available blocks, such as a sequential order of free blocks, of the memory 104 to which data may be written. The controller 120 may update the mapping data 150 such that the blocks indicated in the free blocks queue alternate allocation between ports (e.g., memory ports) to substantially equalize writes between the memory ports. As another example, the controller 120 may allocate groups of storage elements (e.g., wordlines or blocks) based on read counts associated with the memory 104. To illustrate, the controller 120 may determine, based on the read counts, that data is read more frequently from one memory port than from another memory port. For example, a difference between a value of a read count corresponding to the first memory port 170 and a value of a read count corresponding to the second memory port 174 may satisfy (e.g., be greater than or equal to) a threshold amount. Accordingly, the controller 120 may re-allocate groups of storage elements amongst the memory ports 170, 174, based on the read counts, to move block assignments between ports to substantially equalize read traffic on the busses 142, 146 and/or to substantially equalize read activity at the memory ports 170, 174. Alternatively, or in addition, the controller 120 may allocate the storage elements among the multiple ports, such that high-priority data is routed via a particular port designated as a low-use port and/or designated as a high-reliability port (e.g., a port corresponding to relatively high-reliability data storage elements) and/or such that non-critical data is associated with or is assigned to another port designated as a high-use port and/or designated as a port corresponding to data storage elements that may have reduced reliability.

In a particular embodiment, the controller 120 may be configured to enable the first codeword 160 to be written the memory 104 concurrently with reading a representation of the second codeword 162 from the memory 104 or writing the second codeword 162 to the memory 104. For example, the user data 132 may be associated with a first write command and second write command. In this example, the address mapping module 152 may determine physical addresses associated with the first write command and the second write command. Additionally, the address mapping module 152, using the mapping data 150, may determine at least one port (of the multiple ports, such as the control ports 140, 144 and/or the memory ports 170, 172) associated with each write command. When the first write command is associated with the first memory port 170 and the second write command is associated with the second memory port 174, the ECC engine 122 may generate the first codeword 160 and second codeword 162, and the first codeword 160 may be provided to the memory 104 via the first control port 140 and the first bus 142 concurrently (e.g., at least partially overlapping in time) with providing the second codeword 162 via the second control port 144 and second bus 146 to the memory 104.

As another example, when the user data 132 is associated with a first write command and a first read command, the address mapping module 152 may determine physical addresses associated with the first write command and the first read command. Based on the mapping data 150, the address mapping module 152 may determine ports associated with each physical address (associated with the first write command and the first read command). When the first write command is associated with the first memory port 170 and the first read command is associated with second memory port 174, the first codeword 160 (associated with the first write command) may be provided to the memory 104 via the first control port 140 and first bus 142 concurrently with the second codeword 162 being received from the second memory port 174 of the memory 104 via the second control port 144 and the second bus 146. Thus, the multiple ports (e.g., the control ports 140, 144 and/or the memory ports 170, 174) and/or multiple buses enable parallel operation (for read commands and/or write commands) via the multiple ports.

Although FIG. 1 illustrates two ports (e.g. the first memory port 170 and the second memory port 174) at the memory 104, in other embodiments the memory 104 may include more than two ports. Additionally, in some embodiments, each memory port of the memory 104 may be associated with corresponding latches, read/write circuitry, or other support circuitry within the memory 104. For example, a particular memory port of the memory 104 may correspond to a dedicated set of one or more latches, dedicated read/write circuitry, or a combination thereof, as an illustrative, non-limiting example. Alternatively, or in addition, although FIG. 1 illustrates two ports (e.g., the first control port 140 and the second control port 144) at the controller 120, in other embodiments the controller 120 may include fewer than two ports or more than two ports. When the controller 120 includes a plurality of ports, each port of the controller 120 may be associated with a corresponding bus. When the controller 120 includes more than two ports, more than two codewords may be transmitted between the memory 104 and the controller 120 concurrently. Additionally, in some embodiments, each control port of the controller 120 may be associated with corresponding latches, read/write circuitry, and/or other support circuitry within the memory 104.

In a particular embodiment, the mapping data 150 maps the first bus 142 (e.g., a first data bus) corresponding to the first memory port 170 of the multiple memory ports to a first set of one or more wordlines of the memory. Alternatively, or in addition, the mapping data 150 may map the second bus 146 (e.g., a second data bus) corresponding to the second memory port 174 of the multiple memory ports to a second set of one or more wordlines of the memory 104. In another particular embodiment, the memory 104 includes a plurality of stacked memory dies. Additionally, a corresponding portion of the mapping data 150 may be stored at and read from each of the stacked memory dies.

The mapping data 150 and/or the modified mapping data 156 may be stored at the memory 104. Additionally, the mapping data 150 and/or the performance metrics 154 may be stored at a memory (not shown), such as a random access memory, of the controller 120. The memory of the controller 120 may be a single memory component, may include multiple distinct memory components, and/or multiple different types (e.g., volatile memory and/or non-volatile) of memory components. In other implementations, at least a portion of the mapping data 150 and/or the modified mapping data 156 may be stored at a memory of the host device 130, at another memory that is coupled to the controller 120, or a combination thereof.

By having multiple ports (e.g., multiple memory ports and/or multiple control ports), the controller 120 may be able to concurrently to read from and/or write data to the memory 104. Additionally, the controller 120 may update or modify the mapping data (e.g., the mapping data 150) to modify the mapping of the multiple ports to the memory 104 based on information, such as performance metrics associated with the memory 104. By updating or modifying the mapping data, the controller 120 may balance performance and/or traffic among the multiple ports to reduce a "worst-case" performance scenario of the data storage device 102.

Figure 2:
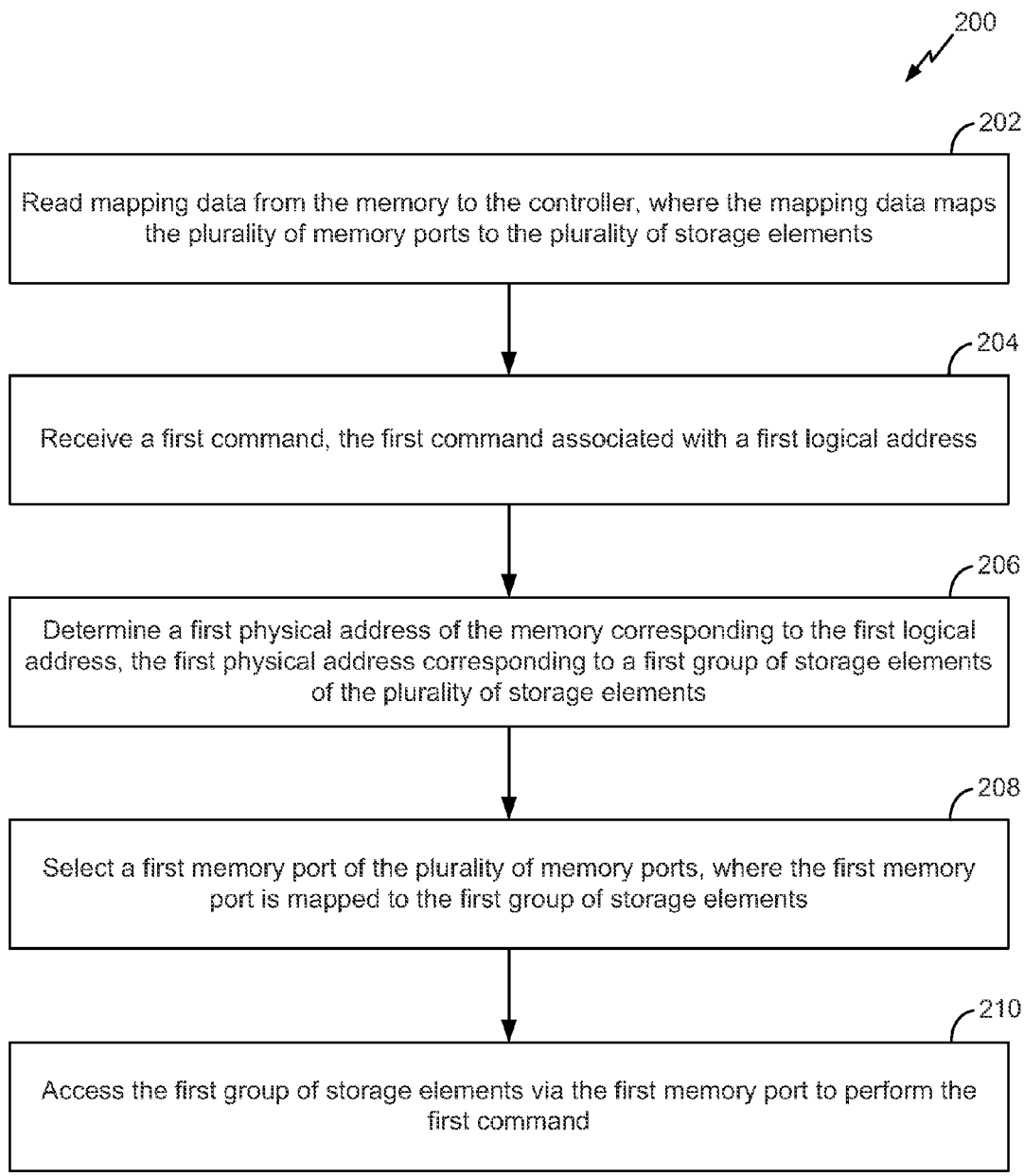
FIG. 2 is a flow diagram of a first illustrative embodiment of a method to access storage elements of a multiport memory.

Referring to FIG. 2, an illustrative embodiment of a method 200 to access storage elements of a multiport memory is shown. For example, the method 200 may be performed by a controller of the data storage device, such as by the controller 120 of the data storage device 102 of FIG. 1.

The method 200 includes, at 202, reading mapping data from a memory to a controller. The mapping data maps the plurality of memory ports to the plurality of storage elements. For example, the controller 120 may read the mapping data 150 from the memory 104 at startup or power-up of the controller 120.

The method 200 also includes, at 204, receiving a first command. For example the first command may be received from a host device coupled to the data storage device. The first command may be associated with a first logical address. To illustrate, the data storage device 102 may receive the user data 132 from the host device 130 of FIG. 1. The user data 132 may include a first command associated with a first logical address.

The method 200 may also include, at 206, determining a first physical address of the memory that corresponds to the first logical address. The first physical address may correspond to a first group of storage elements of a plurality of storage elements of a memory. For example, in FIG. 1, the address mapping module 152 may use the mapping data 150 or other data to determine a physical address corresponding to the logical address indicated by the user data 132.

The method 200 also includes, at 208, selecting a first memory port of a plurality of memory ports. The first memory port is mapped to a first group of storage elements of the memory. For example, in FIG. 1, the address mapping module 152 may use the mapping data 150 to map the physical address to a group of storage elements 106 or 110, and a corresponding port, such as the first memory port 170 or the second memory port 174.

The method 200 also includes, at 210, accessing the first group of storage elements via the first memory port to perform the first command. For example, in FIG. 1, the controller 120 may access the first group of storage elements 106 via the first memory port 170, the first control port 140, and the first bus 142 when the physical address associated with the command is mapped to the first group of storage elements 106 and the first memory port 170.

Thus, mapping data 150 may be used to associate particular ports with particular groups of storage elements in order to facilitate dynamic reallocation of storage elements among multiple ports and to increase throughput when reading data from or writing data to the memory.

Figure 3:
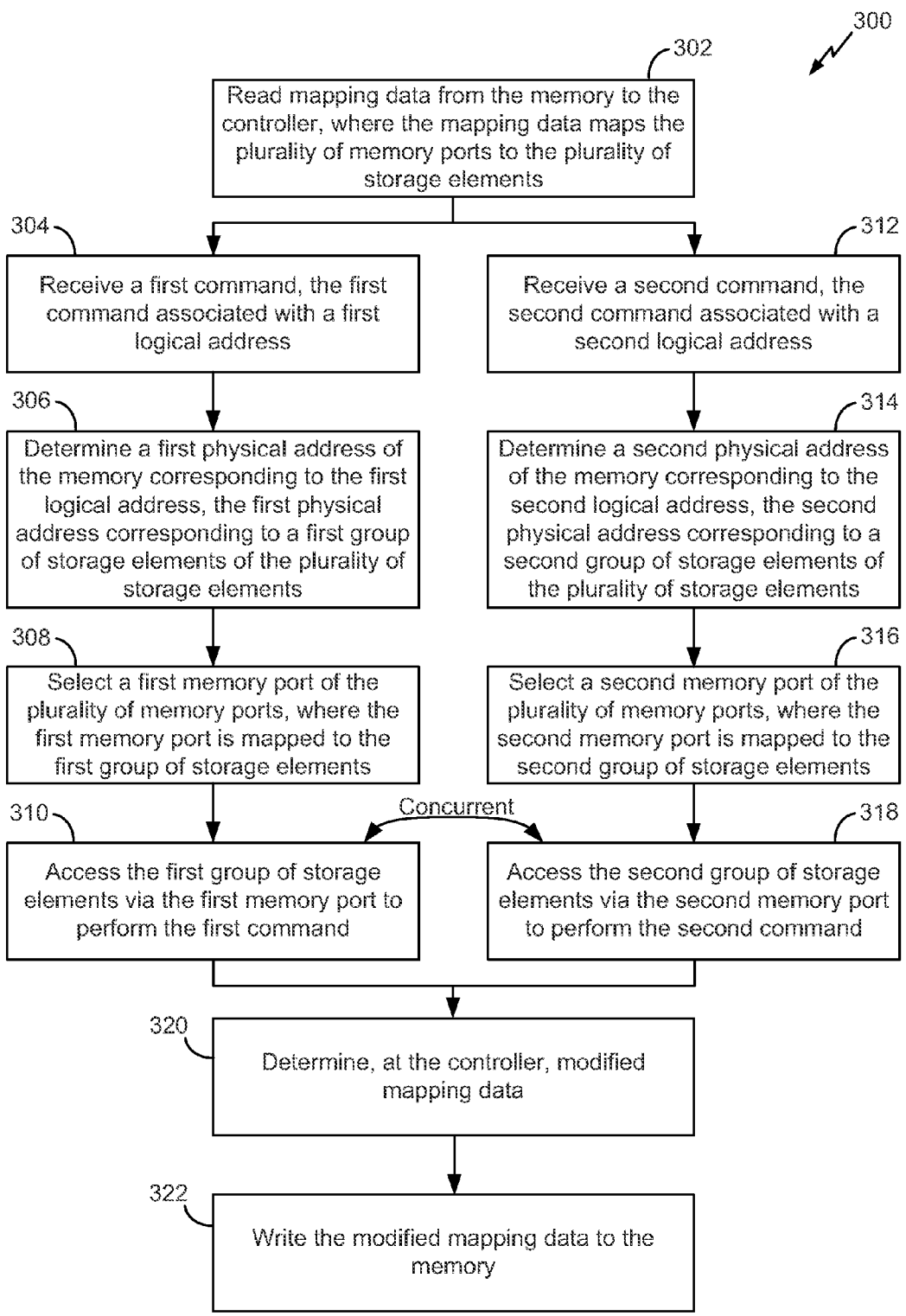
FIG. 3 is a flow diagram of a second illustrative embodiment of a method to access storage elements of a multiport memory.

Referring to FIG. 3, an illustrative embodiment of a method 300 to access storage elements of a multiport memory is shown. For example, the method 300 may be performed by a controller of the data storage device, such as by the controller 120 of the data storage device 102 of FIG. 1

The method 300 includes, at 302, reading mapping data from a memory to a controller. The mapping data maps the plurality of memory ports to the plurality of storage elements. For example, the controller 120 may read the mapping data 150 from the memory 104 at startup or power-up of the controller 120.

The method 300 also includes, at 304, receiving a first command. For example the first command may be received from a host device coupled to the data storage device. The first command may be associated with a first logical address. To illustrate, the data storage device 102 may receive the user data 132 from the host device 130 of FIG. 1. The user data 132 may include or be associated with a first command associated with a first logical address.

The method 300 may also include, at 306, determining a first physical address of the memory that corresponds to the first logical address. The first physical address may correspond to a first group of storage elements of a plurality of storage elements of a memory. For example, in FIG. 1, the address mapping module 152 may use the mapping data 150 or other data to determine a physical address corresponding to the logical address of the user data 132.

The method 300 also includes, at 308, selecting a first memory port of a plurality of memory ports. The first memory port is mapped to a first group of storage elements of the memory. For example, in FIG. 1, the address mapping module 152 may use the mapping data 150 to map the physical address to a group of storage elements 106 or 110, and a corresponding port, such as the first memory port 170 or the second memory port 174.

The method 300 also includes, at 310, accessing the first group of storage elements via the first memory port to perform the first command. For example, in FIG. 1, the controller 120 may access the first group of storage elements 106 via the first memory port 170, the first control port 140, and the first bus 142 when the physical address associated with the command is mapped to the first group of storage elements 106 and the first memory port 170.

The method 300 may also include receiving a second command, at 312. For example the second command may be received from the host device coupled to the data storage device. The second command may be associated with a second logical address. To illustrate, the data storage device 102 may receive the user data associated with the second command from the host device 130 of FIG. 1.

The method 300 may also include, at 314, determining a second physical address of the memory that corresponds to the second logical address. The second physical address may correspond to a second group of storage elements of a plurality of storage elements of a memory. For example, in FIG. 1, the address mapping module 152 may use the mapping data 150 or other data to determine a physical address corresponding to the logical address indicated by the second command.

The method 300 also includes, at 316, selecting a second memory port of the plurality of memory ports. The second memory port is mapped to a second group of storage elements of the memory. For example, in FIG. 1, the address mapping module 152 may use the mapping data 150 to map the physical address to a group of storage elements 106 or 110, and a corresponding port, such as the first memory port 170 or the second memory port 174. In a particular embodiment, the second physical address is mapped to the second memory port 174 and the first physical address is mapped to the first memory port 170.

The method 300 also includes, at 318, accessing the second group of storage elements via the second memory port to perform the second command. For example, in FIG. 1, the controller 120 may access the second group of storage elements 110 via the second memory port 174, the second control port 144, and the second bus 146 when the physical address associated with the second command is mapped to the second group of storage elements 110 and the second memory port 174.

In a particular embodiment, the first group of storage elements may be accessed via the first port concurrently (e.g., at least partially overlapping in time) with accessing the second group of storage elements via the second port. For example the first command may be performed concurrently with performing the second command. In a particular embodiment, the first command is a read command and the second command is a write command.

The method 300 may also include, after reading the mapping data from the memory, determining modified mapping data at the controller, at 320. For example the modified mapping data may be determined based on performance metrics, such as the performance metrics 154 of FIG. 1.

The method 300 may also include, at 322, writing the modified mapping data to the memory. For example, the modified mapping data 156 may be provided to the memory 104 such that, during a subsequent power up of the controller 120, the modified mapping data 156 is provided to the controller 120 to enable dynamic allocation of the ports (e.g., the memory ports and/or control ports) to particular groups of storage elements based on the performance metrics 154. As another example, the modified mapping data 156 may be provided to the memory 104 to dynamically reallocate one or more ports of the data storage device 102 "on the fly" (e.g., during operation of the data storage device 102) without having to wait for a subsequent power up of the controller 120 (or the data storage device 102).

In a particular embodiment, the first command is a first read command and the second command is a second read command. Performing the first command (e.g., the first read command) may include latching first data values read from the first group of storage elements at a first set of latches associated with the first memory port. Performing the second command (e.g., the second read command) may include latching second data values read from the second group of storage elements at a second set of latches associated with the second memory port.

In another particular embodiment, the first command is a first write command and the second command is a second write command. Performing the first command (e.g., the first write command) may include writing first data values to the first group of storage elements using a first set of charge pumps that is associated with the first memory port. Performing the second command (e.g., the second write command) may include writing second data values to the second group of storage elements using a second set of charge pumps that is associated with the second memory port.

Thus, mapping data 150 may be used to associate particular ports with particular groups of storage elements in order to facilitate dynamic reallocation storage elements among ports and to increase throughput when reading data from or writing data to the memory.

The method 200 of FIG. 2 and/or the method 300 of FIG. 3 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 200 of FIG. 2 and/or the method 300 of FIG. 3 can be initiated or controlled by one or more processors, such as one or more processors included in or coupled to a controller. A controller configured to perform the method 200 of FIG. 2 and/or the method 300 of FIG. 3 may be able to utilize multiple ports included in a data storage device, such as the data storage device. For example, the controller may be configured to map multiple control ports and/or multiple memory ports and/or may be configured to modify a mapping of the control ports and/or the multiple memory ports.

Figure 4:
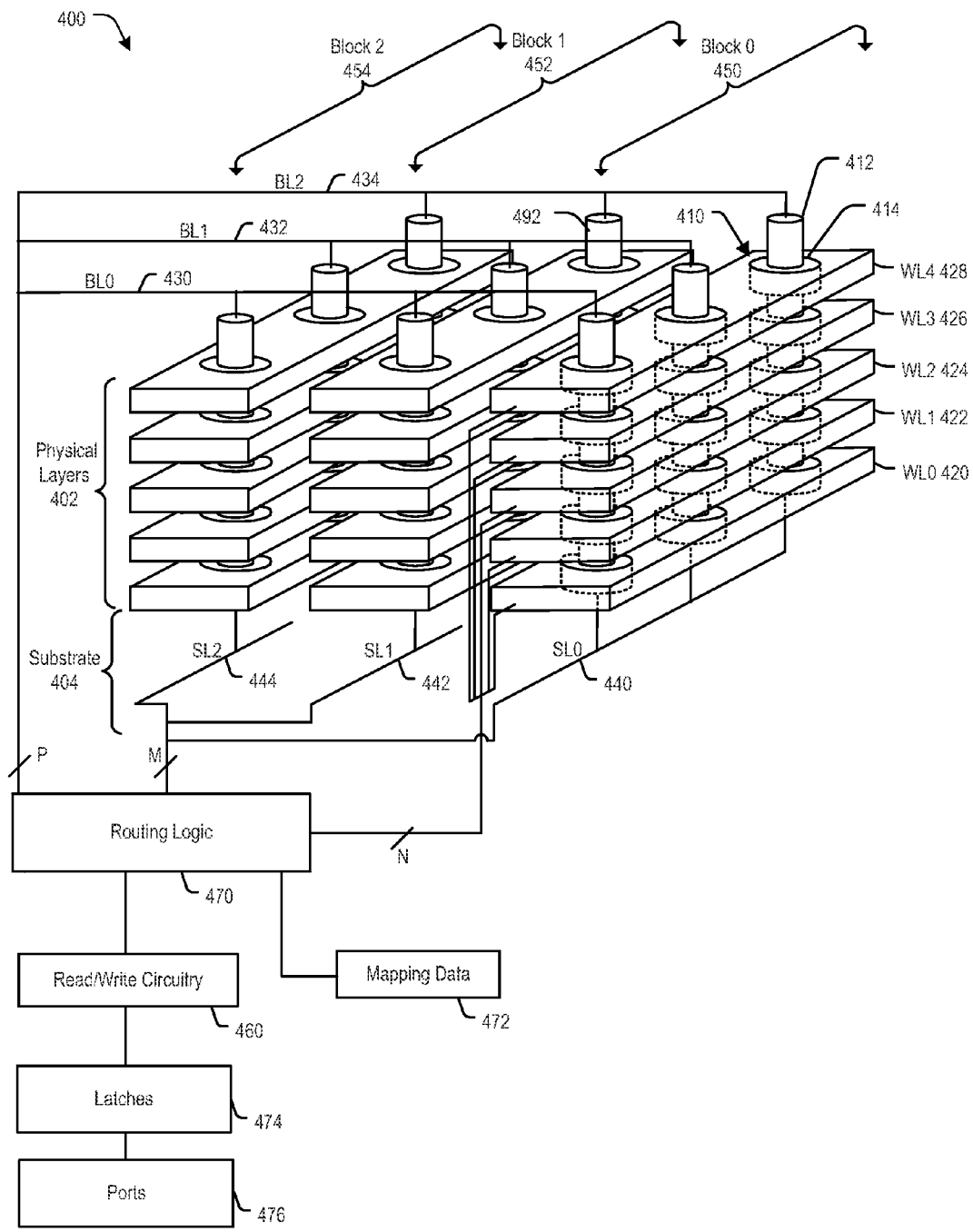
FIG. 4 is a block diagram of a particular embodiment of the memory of the data storage device of FIG. 1.

FIG. 4 illustrates an embodiment of a 3D memory 400 in a NAND flash configuration. The 3D memory 400 may correspond to the memory 104 of FIG. 1. The 3D memory 400 includes multiple physical layers, such as physical layers 402, that are monolithically formed above a substrate 404, such as a silicon substrate. The multiple physical layers may include. Storage elements (e.g., memory cells), such as a representative memory cell 410, are arranged in arrays in the physical layers 402.

The representative memory cell 410 (e.g., a storage element) includes a charge trap structure 414 between a wordline/control gate (WL4) 428 and a conductive channel 412. Charge may be injected into or drained from the charge trap structure 414 via biasing of the conductive channel 412 relative to the wordline 428. For example, the charge trap structure 414 may include silicon nitride and may be separated from the wordline 428 and the conductive channel 412 by a gate dielectric, such as a silicon oxide. An amount of charge in the charge trap structure 414 affects an amount of current through the conductive channel 412 during a read operation of the memory cell 410 and indicates one or more bit values that are stored in the memory cell 410.

The 3D memory 400 includes multiple erase blocks, including a first block (block 0) 450, a second block (block 1) 452, and a third block (block 2) 454. Each block 450-454 includes a "vertical slice" of the physical layers 402 that includes a stack of wordlines, illustrated as a first wordline (WL0) 420, a second wordline (WL1) 422, a third wordline (WL2) 424, a fourth wordline (WL3) 426, and the fifth wordline (WL4) 428. Multiple conductive channels (having a substantially vertical orientation with respect to FIG. 4) extend through the stack of wordlines. Each conductive channel is coupled to a storage element in each wordline 420-428, forming a NAND string of storage elements. FIG. 4 illustrates three blocks 450-454, five wordlines 420-428 in each block, and three conductive channels in each block for clarity of illustration. However, the 3D memory 400 may have more than three blocks, more than five wordlines per block, and more than three conductive channels per block.

The 3D memory 400 include ports 476 (e.g., multiple ports), latches 474, read/write circuitry 460, and routing logic 470. The ports 476 may be configured to receive data from or send data to a controller coupled to the 3D memory 400. For example, the ports 476 may include or correspond to the memory ports 170, 174 of FIG. 1. The latches 474 may be configured to latch data read from the 3D memory 400 or data to be written to the 3D memory 400. The latches 474 (e.g., data latches) may include or correspond to the latches 184 of FIG. 1.

The read/write circuitry 460 is coupled to the conductive channels via the routing logic 470 and multiple conductive lines, illustrated as a first bit line (BL0) 430, a second bit line (BL1) 432, and a third bit line (BL2) 434 at a "top" end of the conducive channels (e.g., farther from the substrate 404) and a first source line (SL0) 440, a second source line (SL1) 442, and a third source line (SL2) 444 at a "bottom" end of the conductive channels (e.g., nearer to or within the substrate 404). The routing logic 470 may include or correspond to the routing logic 151 of FIG. 1. The routing logic 470 may be coupled to mapping data 472, such as the mapping data 150 of FIG. 1. The routing logic 470 is illustrated as coupled to the bit lines 430-434 via "P" control lines, coupled to the source lines 440-444 via "M" control lines, and coupled to the wordlines 420-428 via "N" control lines. Each of P, M, and N may have a positive integer value based on the specific configuration of the 3D memory 400. In the illustrative example of FIG. 4, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 492 and a particular source line may be coupled to the top of the conductive channel 412. The bottom of the conductive channel 492 may be coupled (e.g., electrically coupled) to the bottom of the conductive channel 412. Accordingly, the conductive channel 492 and the conductive channel 412 may be coupled in series and may be coupled to the particular bit line and the particular source line.

The read/write circuitry 460 may operate as described with respect to the read/write circuitry 180 of FIG. 1. For example, data may be stored to storage elements coupled to the wordline 428 and the read/write circuitry 460 may read bit values from the storage elements. As another example, the read/write circuitry 460 may apply selection signals to control lines coupled to the wordlines 420-428, the bit lines 430-434, and the source lines 440-442 to cause a programming voltage (e.g., a voltage pulse or series of voltage pulses) to be applied across selected storage element(s) of the selected wordline (e.g., the fourth wordline 428).

During a read operation, the controller 120 may receive a request from a host device, such as the host device 130 of FIG. 1. The controller 120 may send a read command to the 3D memory 400 via a particular one of the ports 476 based on the mapping data 472. The controller 120 may cause the read/write circuitry 460 to read bits from particular storage elements of the 3D memory 400 by applying appropriate signals to the control lines to cause storage elements of a selected wordline to be sensed. Accordingly, the 3D memory 400 may be configured to read from and write data to one or more storage elements.

Figure 5:
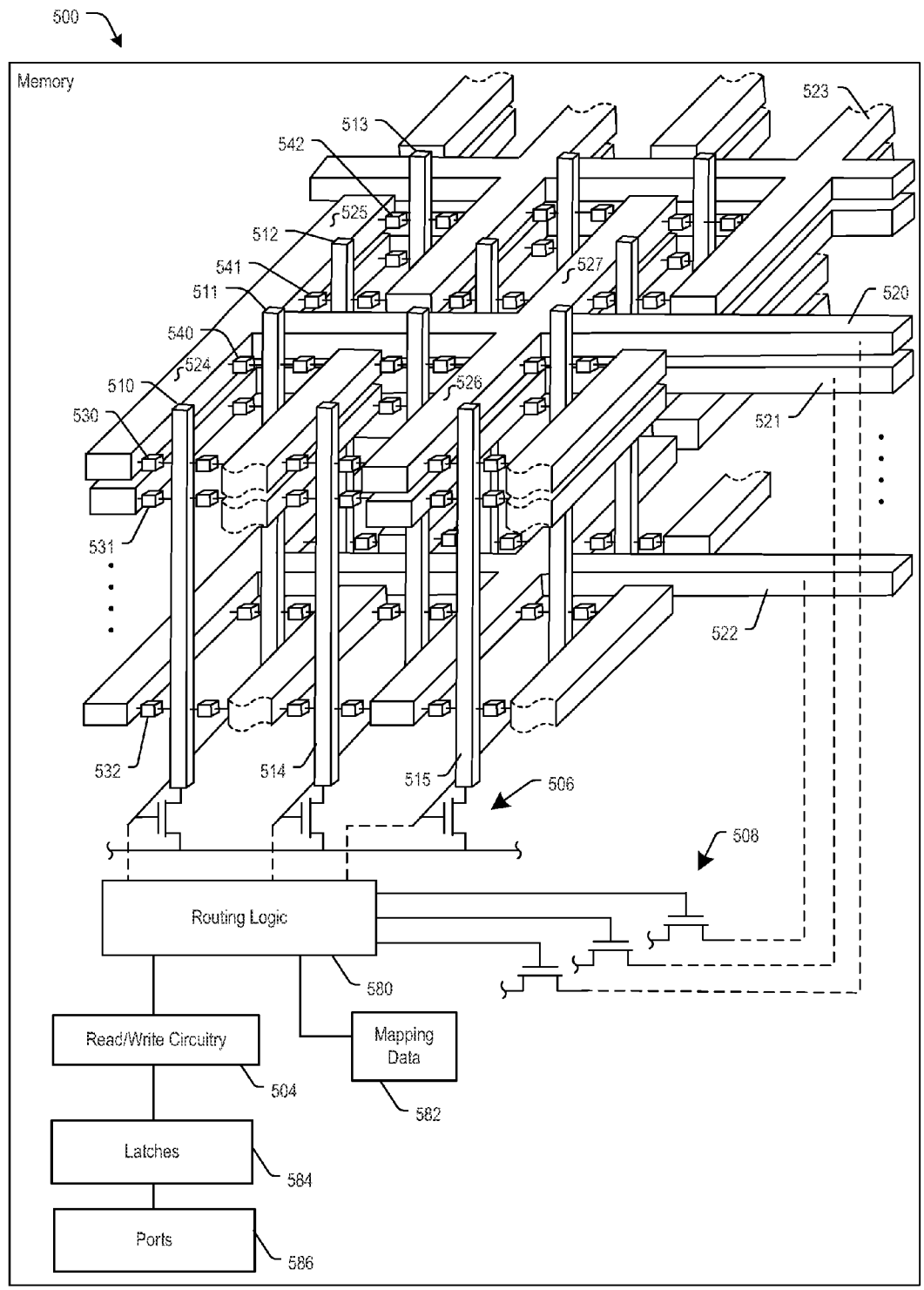
FIG. 5 is a block diagram of another particular embodiment of memory of the data storage device of FIG. 1.

FIG. 5 is a diagram of a particular embodiment of a memory 500. The memory 500 may be included in the data storage device 102 of FIG. 1. FIG. 5 illustrates a portion of a three-dimensional architecture of the memory 500, such as the memory 104. In the embodiment illustrated in FIG. 5, the memory 500 is a vertical bit line Resistive Random Access Memory (ReRAM) with a plurality of conductive lines in physical layers over a substrate (e.g., substantially parallel to a surface of the substrate), such as representative wordlines 520, 521, 522, and 523 (only a portion of which is shown in FIG. 5) and a plurality of vertical conductive lines through the physical layers, such as representative bit lines 510, 511, 512, and 513. The wordline 520, 521, and 522 may include or correspond to a group of one or more physical layers.

The memory 500 also includes a plurality of resistance-based storage elements (e.g., memory cells), such as representative storage elements 530, 531, 532, 540, 541, and 542, each of which is coupled to a bit line and a wordline in arrays of memory cells in multiple physical layers over the substrate (e.g., a silicon substrate). The plurality of resistance-based storage elements may include the first group of storage elements 106 and the second group of storage elements 110 of FIG. 1.

The memory 500 include ports 586 (e.g., multiple ports), latches 584, read/write circuitry 504, and routing logic 580. The ports 586 may be configured to receive data from or send data to a controller (e.g., the controller 120 of FIG. 1) coupled to the memory 500. For example, the ports 586 may include or correspond to the memory ports 170, 174 of FIG. 1. The latches 584 may be configured to latch data read from the memory 500 or data to be written to the memory 500. The latches 584 (e.g., data latches) may include or correspond to the latches 184 of FIG. 1. The memory 500 also includes read/write circuitry 504, such as the read circuitry 140 and/or the write circuitry 142 of FIG. 1. The read/write circuitry 504 is coupled to wordline drivers 508 and bit line drivers 506 via the routing logic 580. In some embodiments, the read/write circuitry 504 may include the routing logic 580. The routing logic 580 may include or correspond to the routing logic 151 of FIG. 1. The routing logic 580 may be coupled to mapping data 582, such as the mapping data 150 of FIG. 1.

In the embodiment illustrated in FIG. 5, each of the wordlines includes a plurality of fingers (e.g., a first wordline 520 includes fingers 524, 525, 526, and 527). Each finger may be coupled to more than one bit line. To illustrate, a first finger 524 of the first wordline 520 is coupled to a first bit line 510 via a first storage element 530 at a first end of the first finger 524 and is coupled to a second bit line 511 via a second storage element 540 at a second end of the first finger 524.

In the embodiment illustrated in FIG. 5, each bit line may be coupled to more than one wordline. To illustrate, the first bit line 510 is coupled to the first wordline 520 via the first storage element 530 and is coupled to a third wordline 522 via a third storage element 532.

During a write operation, the controller 120 may receive data from a host device, such as the host device 130 of FIG. 1. The controller 120 may send the data (or a representation of the data) to the memory 500. For example, the controller 120 may encode the data prior to sending the encoded data to the memory 500.

For example, the controller 120 may send the data to the latches 584 via one of the ports 586. The read/write circuitry 504 may receive the data from the latches 584 and may write the data to storage elements corresponding to the destination of the data via the routing logic 580. For example, the routing logic 580 (e.g., the read/write circuitry 504) may apply selection signals to selection control lines coupled to the wordline drivers 508 and the bit line drivers 506 to cause a write voltage to be applied across a selected storage element. For example, to select the first storage element 530, the read/write circuitry 504 may activate the wordline drivers 508 and the bit line drivers 506 to drive a programming current (also referred to as a write current) through the first storage element 530. To illustrate, a first write current may be used to write a first logical value (e.g., a value corresponding to a high-resistance state) to the first storage element 530, and a second write current may be used to write a second logical value (e.g., a value corresponding to a low-resistance state) to the first storage element 530. The programming current may be applied by generating a programming voltage across the first storage element 530 by applying a first voltage to the first bit line 510 and to wordlines other than the first wordline 520 and applying a second voltage to the first wordline 520. In a particular embodiment, the first voltage is applied to other bit lines (e.g., the bit lines 514, 515) to reduce leakage current in the memory 500.

During a read operation, the controller 120 may receive a request from a host device, such as the host device 130 of FIG. 1. The controller 120 may cause the read/write circuitry 504 (via the routing logic 580) to read bits from particular storage elements of the memory 500 by applying selection signals to selection control lines coupled to the wordline drivers 508 and the bit line drivers 506 to cause a read voltage to be applied across a selected storage element. For example, to select the first storage element 530, the read/write circuitry 504 may activate the wordline drivers 508 and the bit line drivers 506 to apply a first voltage (e.g., 0.7 volts (V)) to the first bit line 510 and to wordlines other than the first wordline 520. A lower voltage (e.g., 0 V) may be applied to the first wordline 520. Thus, a read voltage is applied across the first storage element 530, and a read current corresponding to the read voltage may be detected at a sense amplifier of the read/write circuitry 504. The read current corresponds (via Ohm's law) to a resistance state of the first storage element 530, which corresponds to a logical value stored at the first storage element 530. The logical value read from the first storage element 530 and other elements read during the read operation may be provided to the latches 584 (e.g., data latches). From the data latches 584, the data may be provided to controller 120 via particular port of the ports 586 (e.g., memory ports). The particular port may be selected (e.g., determined) based on the mapping data 582.

Although various components of the data storage device 102 and the host device 130 depicted herein are illustrated as block components and described in general terms, such components may include one or more microprocessors, state machines, or other circuits configured to enable the controller 120 and/or the memory 104 of FIG. 1 to perform operations described herein. For example, various components of the controller 120 and/or the memory 104 of FIG. 1 may represent physical components, such as hardware controllers, state machines, logic circuits, or other structures, to enable reading data from and writing data to the memory 104. One or more aspects of the controller 120 and/or the memory 104 may be implemented using a microprocessor or microcontroller programmed to perform operations described herein, such as one or more operations of the method 300 of FIG. 3 and/or the method 400 of FIG. 4. In a particular embodiment, the controller 120 and/or the memory 104 includes a processor executing instructions that are stored at a memory, such as a non-volatile memory of the data storage device 102 or the host device 130. Alternatively or additionally, executable instructions that are executed by the processor may be stored at a separate memory location that is not part of the non-volatile memory, such as at a read-only memory (ROM) of the data storage device 102 or the host device 130.

In an illustrative example, the processor may execute the instructions to read mapping data from a memory to a controller. The mapping data maps a plurality of memory ports to a plurality of storage elements (of the memory). The instructions to read the mapping data may include instructions to determine a location (e.g., an address, such as a logical address) of the mapping data at the memory, instructions to generate a read instruction to read the mapping data, instructions to send the read instruction to the memory, instructions to receive the mapping data from the memory, and/or instructions to store the mapping data at a memory, such as a random access memory (RAM) of the controller, as illustrative, non-limiting examples. The processor may execute instructions to receive a first command that is associated with a first logical address. The instructions to receive the first command may include instructions to receive the first command from a host device, instructions to determine whether the first command is associated with a read operation or a write operation, instructions to identify the first logical address, and/or instructions to parse the first command, as illustrative, non-limiting examples. The processor may execute instructions to determine a first physical address of the memory corresponding to the first logical address. The first physical address corresponds to a first group of storage elements of the plurality of storage elements. The instructions to determine the first physical address may include instructions to provide the first logical address to an address mapping module and/or instructions to map the first logical address to the first physical address, as illustrative, non-limiting examples. The processor may execute instructions to select a first memory port of the plurality of memory ports. The first memory port is mapped to the first group of storage elements. The instructions to select the first memory port may include instructions to access mapping data and/or instructions to identify the first memory port based on the mapping data and based on the first physical address, as illustrative, non-limiting examples. The processor may execute instructions to access the first group of storage elements via the first memory port to perform the first command. The instructions to access the first group of storage elements may include instructions to generate an access command, such as a read request or a write request, instructions to send the access command to the memory via the first memory port, instructions to execute the access command, and/or instructions to receive data from the memory responsive to the access command, as illustrative, non-limiting examples.

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   in a data storage device including ports comprising memory ports of a non-volatile memory that has a three-dimensional (3D) memory configuration and control ports of a controller that is associated with operation of a plurality of storage elements of the non-volatile memory, the ports coupling the controller to the non-volatile memory, the ports being internal to the data storage device and distinct from a host interface, performing:
   reading port-to-memory mapping data from the non-volatile memory to the controller, wherein the portto-memory mapping data maps the plurality of storage elements to the memory ports and to the control ports; and modifying, at the controller, the port-to-memory mapping data based on one or more performance metrics associated with a wordline that includes at least one of the plurality of storage elements, the modifying including:

identifying, by the controller, the wordline based on the one or more performance metrics; and in response to identifying the wordline, re-allocating the wordline from a first memory port of the memory ports to a second memory port of the memory ports.

2. The method of claim 1, wherein:

the non-volatile memory includes routing logic and a first copy of the port-to-memory mapping data and is configurable to route data to and from the plurality of storage elements based on the first copy, the first copy is modified at the non-volatile memory, and a second copy of the port-to-memory mapping data is modified at the controller.

3. The method of claim 1, wherein the non-volatile memory includes a plurality of stacked memory dies, wherein the port-to-memory mapping data is included in a module that maps logical addresses to physical addresses of the non-volatile memory, and wherein a corresponding portion of the port-to-memory mapping data is read from each of the plurality of stacked memory dies.

4. The method of claim 1, wherein:

the port-to-memory mapping data maps:

the wordline to the first memory port; and a second wordline of the non-volatile memory to the first memory port, the modified port-to-memory mapping data maps:

the wordline to the second memory port, and the second wordlines to the first memory port.

5. The method of claim 1, further comprising sending the modified port-to-memory mapping data to the non-volatile memory and to a memory of the controller, wherein the modified port-to-memory mapping data updates the port-to-memory mapping data at the non-volatile memory and at the memory of the controller.

6. The method of claim 1, further comprising:

determining that the one or more performance metrics indicate decreasing performance of a first set of storage elements associated with the wordline;

determining a second set of storage elements that are distinct from the first set of storage elements and that are mapped to a particular port;

modifying the port-to-memory mapping data to map the first set of storage elements to the particular port;

modifying the port-to-memory mapping data to map the second set of storage elements to one or more ports of the ports, the one or more ports distinct from the particular port; and re-allocating, based on the modified port-to-memory mapping data, the first set of storage elements to the particular port and the second set of storage elements to the one or more ports distinct from the particular port.

7. The method of claim 1, further comprising:

receiving, after re-allocating the word line from the first memory port to the second memory port, a first command, the first command associated with a first logical address;

determining a first physical address of the non-volatile memory corresponding to the first logical address, the first physical address corresponding to a first group of storage elements of the plurality of storage elements; and accessing the first group of storage elements via the first memory port to perform the first command.

8. The method of claim 7, further comprising:

receiving a second command, the second command associated with a second logical address;

determining a second physical address of the non-volatile memory corresponding to the second logical address, the second physical address corresponding to a second group of storage elements of the plurality of storage elements; and concurrently with accessing the first group of storage elements via the first memory port to perform the first command, accessing the second group of storage elements to perform the second command.

9. The method of claim 8, wherein:

the first command includes a read command and the second command includes a write command, or the first command includes a first read command and the second command includes a second read command.

10. The method of claim 1, wherein multiple busses coupled to the memory ports and to the non-volatile memory enable data transfer between the memory ports and the non-volatile memory, and wherein for each storage element of a set of storage elements associated with at least one performance metric, the set of storage elements is re-allocated to the memory ports by modifying the port-to-memory mapping data, the modified port-to-memory mapping data configured to substantially equalize read traffic on the busses.

11. The method of claim 1, wherein a performance metric of the one or more performance metrics is based on at least one of:

a reliability measure of the wordline, or a count of write/erase cycles of the wordline.

12. The method of claim 1, further comprising:

determining that a performance metric of the wordline indicates decreased performance of the wordline; and modifying the port-to-memory mapping data to substantially equalize read traffic for each individual port of the ports.

13. The method of claim 1, wherein the non-volatile memory comprises one of a resistive random access memory (ReRAM) or a flash memory.

14. The method of claim 1, wherein the one or more performance metrics comprises latency, throughput, or a bus queue depth.

15. A data storage device comprising:

a non-volatile memory that has a three-dimensional (3D) memory configuration;

a controller associated with operation of a plurality of storage elements of the non-volatile memory; and a plurality of ports coupling the controller to the non-volatile memory, the plurality of ports including memory ports of the non-volatile memory and control ports of the controller and being internal to the data storage device and distinct from a host interface, wherein the controller is configured to:

read port-to-memory mapping data from the non-volatile memory, wherein the port-to-memory mapping data maps the plurality of storage elements to the memory ports and to the control ports; and modify, at the controller, the port-to-memory mapping data based on:

one or more performance metrics associated with a wordline that includes at least one of the plurality of storage elements; and identification, by the controller, of the wordline based on the one or more performance metrics, wherein the modified port-to-memory mapping data indicates re-allocation of the wordline from a first memory port of the plurality of ports to a second memory port of the plurality of ports.

16. The data storage device of claim 15, wherein:
the non-volatile memory includes routing logic and a first copy of the port-to-memory mapping data, the routing-logic configurable to route data to and from the plurality of storage elements based on the first copy, and
the controller is further configured to modify the first copy and a second copy of the port-to-memory mapping data, the second copy stored at the controller.

17. The data storage device of claim 15, wherein the non-volatile memory includes a plurality of stacked memory dies, wherein the port-to-memory mapping data is included in a module configured to map logical addresses to physical addresses of the non-volatile memory, and wherein a corresponding portion of the port-to-memory mapping data is configured to be read from each of the plurality of stacked memory dies.

18. The data storage device of claim 15, wherein the port-to-memory mapping data is configured to be used by the controller to:
transfer data between a first data bus corresponding to the first memory port and a first wordlines of the non-volatile memory; or
transfer data between a second data bus corresponding to the second memory port and a second wordlines of the non-volatile memory.

19. The data storage device of claim 15, wherein the one or more performance metrics comprise one or more of latency or throughput.

20. The data storage device of claim 15, wherein the re-allocation includes a mapping of one or more of the storage elements associated with at least one performance metric to a port, the port dedicated for use with increased latency operations including background operations.

21. The data storage device of claim 15, wherein the controller is further configured to:
in response to receiving a second command associated with a second logical address, determine a second physical address of the non-volatile memory corresponding to the second logical address, the second physical address corresponding to a second group of storage elements of the plurality of storage elements;
select the second memory port using the modified port-to-memory mapping data, wherein the second memory port is mapped to the second group of storage elements; and
concurrently with accessing a first group of storage elements of the plurality of storage elements via the first memory port to perform a first command, access the second group of storage elements via the second memory port to perform the second command.

22. The data storage device of claim 21, wherein the first command includes a read command and the second command includes a write command or the first command includes a first read command and the second command includes a second read command.

23. The data storage device of claim 15, wherein the controller is further configured to, after determining the modified port-to-memory mapping data and in response to receiving a first command associated with a first logical address:
determine a first physical address of the non-volatile memory corresponding to the first logical address, the first physical address corresponding to a first group of storage elements of the plurality of storage elements;
select, based on the modified port-to-memory mapping data, a particular memory port of the memory ports, wherein the particular memory port is mapped to the first group of storage elements; and
access the first group of storage elements via the particular memory port to perform the first command.

24. The data storage device of claim 15, further comprising:
a first set of latches associated with the first memory port, the first set of latches configured to latch first data values read from a first group of storage elements of the plurality of storage elements based on a first read command; and
a second set of latches associated with the second memory port, the second set of latches configured to latch second data values read from a second group of storage elements of the plurality of storage elements based on a second read command.

25. The data storage device of claim 21, wherein the first command includes a first write command and the second command includes a second write command.

26. The data storage device of claim 25, further comprising:
a first set of charge pumps associated with the first memory port; and
a second set of charge pumps associated with the second memory port.

27. The data storage device of claim 15, wherein the non-volatile memory comprises one of a resistive random access memory (ReRAM) or a flash memory.

28. The data storage device of claim 15, further comprising multiple busses coupled to the plurality of ports and to the non-volatile memory to enable data transfer between the plurality of ports and the non-volatile memory, wherein for a set of storage elements in which each storage element of the set of storage elements is associated with at least one performance metric that indicates decreased performance of storage elements associated with the performance metric, the set of storage elements is configured to be re-allocated to the plurality of ports based on a modification of the port-to-memory mapping data, the modified port-to-memory mapping data configured to substantially equalize read traffic on the busses.

29. An apparatus comprising:
means for storing information, the means for storing information having a three-dimensional (3D) memory configuration;
means for controlling the means for storing information, the means for controlling associated with operation of a plurality of storage elements associated with the means for storing information; and
means for coupling the means for controlling to the means for storing information, the means for coupling including first means for routing data to and from the means for storing information and second means for routing data to and from the means for controlling, the first means and the second means internal to the apparatus and distinct from means for providing a host interface, the means for controlling configured to:

read port-to-memory mapping data from the means for storing information, wherein the port-to-memory mapping data maps the plurality of storage elements to the first means and to the second means; and modify the port-to-memory mapping data based on:
   one or more performance metrics associated with a wordline that includes at least one of the plurality of storage elements; and
   identification of the wordline based on the one or more performance metrics, wherein the modified port-to-memory mapping data indicates re-allocation of the wordline from a first means for porting data to a second means for porting data.

30. The apparatus of claim 29, wherein:
the means for storing information includes logic means for routing data to and from the plurality of storage elements based on a first copy of the port-to-memory mapping data at the logic means, and
the means for controlling is further configured to modify the first copy and a second copy of the port-to-memory mapping data, the second copy stored at the means for controlling.

* * * * *